United States Patent
Lassen

(10) Patent No.: US 7,284,485 B2
(45) Date of Patent: Oct. 23, 2007

(54) ALIGNMENT ELEMENTS FOR AN APPARATUS FOR HANDLING PRINTING PLATES

(75) Inventor: Bernd Lassen, Mönkeberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 228 days.

(21) Appl. No.: 11/052,682

(22) Filed: Feb. 7, 2005

(65) Prior Publication Data

US 2005/0172847 A1    Aug. 11, 2005

(30) Foreign Application Priority Data

Feb. 6, 2004   (DE) ...................... 10 2004 005 981

(51) Int. Cl.
*B41J 2/435* (2006.01)
(52) U.S. Cl. ...................... 101/477; 347/263
(58) Field of Classification Search ............... 101/477, 101/401.1, 479, 480; 347/263
See application file for complete search history.

(56) References Cited

U.S. PATENT DOCUMENTS 4,833,325 A  5/1989 Torii et al. .................. 250/584
5,469,205 A  11/1995 Boeve et al. ............... 347/263
5,619,246 A  4/1997 Straayer et al. ............. 347/262
6,347,891 B1  2/2002 Muckerheide et al. ...... 395/104

FOREIGN PATENT DOCUMENTS

DE    102 04 750 C1    3/2003
EP    0 583 513 A1    2/1994
JP    2003-057835    2/2003

*Primary Examiner*—Leslie J. Evanisko
(74) *Attorney, Agent, or Firm*—Lauren A. Greenberg; Werner H. Stemer; Ralph E. Locher

(57) ABSTRACT

An apparatus for handling printing plates contains at least one image-setting device and a frame that at least partially encloses the image-setting device. The image-setting device is decoupled from the frame via decoupling feet that stand on the floor through cutouts in the frame. If the image-setting device is decoupled from the frame, it is problematic or at least time-consuming to align the image-setting device and the frame with respect to one another. Alignment is particularly necessary when the frame contains further processing stations and transport systems. Simpler and more rapid alignment can be achieved by at least one guiding alignment element assisting the alignment of the image-setting device and of the frame with respect to one another.

10 Claims, 3 Drawing Sheets

ALIGNMENT ELEMENTS FOR AN APPARATUS FOR HANDLING PRINTING PLATES

BACKGROUND OF THE INVENTION

Field of the Invention

The invention relates to an apparatus for handling printing plates, at least one image-setting device and a frame that at least partially encloses the image-setting device, the image-setting device being decoupled from the frame via decoupling feet that stand on the floor through cutouts in the frame.

In image-setting devices for setting images on printing plates, the printing plates are exposed by a laser, with the result that a corresponding printing image is produced on the surface of the printing plate. Depending on the type of plate, a negative or a positive printing image is produced. The printing image then usually has to be developed in a developing device, with the result that a printing image that can be used in a printing press is formed from the latent printing image produced. In suitable printing plates and laser systems, it is also possible that surface regions of the printing plate are removed by ablation by lasers and a usable, "process-less" printing image is produced immediately in this way.

The aim is to automate the work sequence for producing a printed product as completely as possible. As a result, time and manpower can be saved. For this purpose, for example, the printing plates are stored in cassettes from which they can then be separated automatically. For this purpose, the cassette can then be inserted into what is known as a single cassette loader (SCL) which automatically separates the printing plates and feeds them to appropriate further processing stations. The cassettes can also be stored themselves in what is known as a multi-cassette loader (MCL). Here, it is then possible for cassettes with plates of different formats or surface properties to be made available simultaneously. The individual cassettes can then be fed, for example, automatically to an SCL from the MCL. Here, the individual processing regions can be protected against light, with the result that the generally light-sensitive printing plates are not accidentally exposed.

The printing plates are fed from the SCL, for example, to an exposing device in which they are exposed. The printing plates then have to be fed from the exposing device, for example, to a developing device in which the latent printing image which is situated on the surface of the printing plate is developed. From here, the printing plate has to be transported further to a printing press in which it can be used to print the printed product.

In order to transport the printing plates from an SCL into an exposing device and then onward from the latter in turn, for example into a developing device, it is possible to use automatic transport systems which ensure, in particular, transport of the printing plates which is protected against ambient light.

By use of a transport system of this type, it is possible to transport a printing plate automatically from any first processing station desired to any second station desired. A device for shielding the transport system against light ensures protection of the printing plates against undesired exposure.

For example, the printing plate can be transported initially from an SCL to a punching apparatus and then to the exposing device. It is however, also possible to transport it to the punching apparatus directly after the exposure, even for a second time. In the punching apparatus, holes for later adjustment or for clamping the printing plate in the exposing device and/or in a printing press can be punched.

If the printing plates are transported to the exposing device, a corresponding alignment of the transport system with respect to the exposing device must be ensured.

The exposing device can be, for example, an external drum exposer. The printing plate must then be fed by the transport system onto the surface of the exposing drum in such a way that it can be clamped there.

There may be provision for the transport system to be already transporting further printing plates while a first printing plate is being exposed within the exposing device. For example, a second printing plate that has already been exposed previously in the exposing device can be transported to a punching apparatus or to a developing device.

If the exposing device and the transport system are connected to one another, even if only indirectly, it is at least possible for vibrations from the transport system to be transmitted to the exposing device. As a result, the image setting of the printing plate can be disrupted in such a way that the quality of the printing image is impaired as a result. In particular when various color separations are being set, different deviations in the printing images of the various color separations can occur in the printing plates provided for this purpose. This would lead to discernible worsening of the printed product in the subsequent printing process.

It is therefore desirable for the exposing device to be decoupled from the transport system and further processing stations. The exposing device should favorably stand in a damped manner on a work surface for this purpose and not come into contact with further devices. The only necessary contact during the printing plate transfer is then between the transport system and the exposing device. Similar separations between a recording unit and a possibly moving system are known, for example, from the German Patent DE 102 04 750 C1 for desktop scanners.

The necessary alignment of the exposing device with respect to the transport system represents a problem in an exposing device which is decoupled from a feeding transport system, in order that a printing plate transfer can occur and the printing plate can be clamped in the exposing device in a reproducible manner. The maintenance of register should be considered, in particular for color separations. The alignment of the exposing device with respect to the transport system is very complicated and also time-consuming, in particular if appropriate systems have to be set up at the final customer in the printing works and possibly also have to be aligned there with further processing stations.

SUMMARY OF THE INVENTION

It is accordingly an object of the invention to provide alignment elements for an apparatus for handling printing plates which overcomes the above-mentioned disadvantages of the prior art devices of this general type, in which it is possible to align an exposing device and a transport system, or a frame, in a relatively simple and relatively rapid manner, in particular in the region of a printing works and if further adaptation to other processing stations is desired.

With the foregoing and other objects in view there is provided, in accordance with the invention, an apparatus for handling printing plates. The apparatus contains at least one image-setting device functioning as an exposing device, a frame at least partially enclosing the image-setting device, and decoupling feet for standing on a floor and extending through cutouts formed in the frame. The image-setting device is decoupled from the frame via the decoupling feet. At least one guiding alignment element assists alignment of the exposing device and the frame with respect to one another.

The object of the invention is achieved by an apparatus of the abovementioned generic type having at least one guiding alignment element for assisting the alignment of the image-setting device and a frame with respect to one another.

Using a guiding alignment element of this type, it is advantageously possible to simply and rapidly achieve a basic alignment of the exposing device with respect to the frame. The at least one alignment element can be adjusted, in particular, in advance of the apparatus being set up, for example in a printing works, with the result that it is known in which way the exposing device and/or the frame have to be guided in order that they are aligned with respect to one another. Guiding alignment elements of this type can be, for example, rails or else appropriate markings such as notches, by which either the frame and/or the exposing device or else the eye or indirectly the person who is setting up the apparatus is guided.

In one preferred inventive embodiment, the at least one alignment element should be at least one centering bolt surrounded by the frame for making temporary contact between the exposing device and the frame and for adjusting the image-setting device.

In this way, the image-setting device can be guided by the at least one centering bolt. There can also be a plurality of centering bolts, two centering bolts being intended to be the preferred number. The image-setting device can be aligned by two centering bolts in one plane. According to the invention, the centering bolts should preferably be situated on the lower inner side of the frame. They can be fastened on struts here, for example. The image-setting device can have, for example, rails that slide on the centering bolts; in this way, the image-setting device can then be guided to a preferred, aligned position. However, it can also be sufficient if the centering bolts limit the freedom of movement of the image-setting device in the plane, in that they are in contact with one or two edges of the image-setting device when the latter assumes the desired position. However, the centering bolts can be moved so as to coincide with corresponding marks on the side of the image-setting device, in order that the latter is aligned.

The image-setting device can advantageously be aligned in one plane by two centering bolts, with the result that the alignment is maintained if the frame and/or the image-setting device are/is moved perpendicularly with respect to the plane.

The markings and/or positions of the centering bolts can be produced, for example, uniquely in a suitable environment using suitable tools for adjusting the frame with respect to the exposing device. In this way, it is more easily possible to perform the adjustment, even in regions with, for example, uneven floors or without a special tool.

In the described construction, the upper frame can contain, for example, a transport system and also further processing stations or at least transfer points to the latter. Transfer points or stations of this type can also be present in the lower frame, and they can also advantageously be installed here after adjustment is complete.

In a further advantageous refinement, there is provision for the image-setting device to have at least one centering hole for accommodating at least one gaging rod.

For this purpose, four centering holes, in particular, can be provided. However, it is also possible that more or fewer centering holes are provided. The gaging rods can be inserted into the centering holes. For this purpose, the centering holes should be provided, in particular, in regions of the exposing device that permit through holes. The gaging rods can then touch the floor and/or regions of the frame in the aligned state. Here, the length of the gaging rods should be such that they still reach through the exposing device in this aligned state. It is then possible to measure the length of the sections of the gaging rods that protrudes beyond the exposing device. If the length of the gaging rods is taken into consideration in the case of a repeated set-up, the aligned positioning can be reconstructed. There is provision, in particular, for the centering holes to be provided in the regions of the exposing device that contains the exposer feet. As a result, it is possible to reconstruct the exact position of the exposer feet, and an exposing device that has been aligned once can be aligned again at a second location rapidly and simply. The gaging rods should be removed again later. It is therefore possible to carry out an alignment relative to the floor and/or to the frame via the contact with the gaging rods. The alignment is then maintained even without gaging rods, it then being possible for the exposing device to stand without contact with the frame. Here, the exposer feet should be configured, in particular, as decoupling feet, that is to say they should have a vibration-damping effect and decouple the exposing device from the frame in terms of vibrations.

In an advantageous development, there is provision for at least one centering hole to have a hole for accommodating a centering bolt. The cross section of the centering hole should be changed by this hole in such a way that centering bolts can be accommodated only in some centering holes, preferably in two centering holes in the case of there being two centering bolts. Here, the accommodation can be reproduced in such a way that it is always possible to guarantee appropriate alignment of the exposing device and the frame. As a result, the exposing device is guided in a specific way by the centering bolts and aligned in the plane when it is placed onto the frame. The gaging rods according to the invention, in particular, stand on the frame through the centering holes that accommodate the centering bolts, and it is thus possible to reproduce a height alignment of the exposing device relative to the frame. For this reproducible height alignment, in particular all of the gaging rods, preferably four gaging rods, should stand on the frame through the centering holes, only the gaging rods producing contact between the exposing device and the frame. After the gaging rods have been removed, the exposing device is then aligned with respect to the frame without contact.

The centering holes can be provided favorably in edge regions, for example in spars of the image-setting device. This initially ensures a more accurate alignment, as even relatively small angular rotations at the edge of the exposing device have the effect of relatively large deviations from centering holes and centering bolts. Here, the positions of the holes should be situated in such a way that they do not impair the normal operation of the exposing device. For example, they can be provided in spars that lead to the exposer feet.

Furthermore, according to the invention, at least one markable gaging rod that fits through a centering hole is advantageously provided for adjusting the distance between the frame and the image-setting device.

This at least one gaging rod can be placed through the centering hole onto the centering bolt of the frame or onto other regions of the frame and/or of the floor.

In order to use the at least one gaging rod for simpler adjustment of the image-setting device, it is possible initially for the frame and thus other possible transport systems and/or other processing stations to be aligned with respect to the exposing device; it can be assumed here, for example, that the other processing stations and transport systems can be connected fixedly to the frame, with the result that no increased difficulty during alignment occurs here. The alignment is then carried out, as described above, under ideal conditions, that is to say a floor which is as flat as possible, no vibrations, measuring instruments which are as accurate as possible, etc. If the frame and the exposing device are then aligned in the horizontal plane, the alignment in the vertical plane can take place. This should be performed such that the distance between the centering bolt and the centering hole has to be enlarged in each case in such a way that there is then no contact between the frame and the exposing device.

When the alignment is complete, the centering bolt is therefore no longer situated in the centering hole. The distance that then exists must also be retained for other set-up operations of the whole system. There is therefore provision for a gaging rod according to the invention to be inserted through the at least one centering hole when the alignment is performed. The gaging rod then bears on the centering bolt or on other regions of the frame that are provided for the purpose. The gaging rod should then be marked in such a way that it is easy to comprehend the distance between the centering bolt or the frame and the centering hole as a consequence. If a plurality of centering holes and gaging rods are used, it should be ensured that the gaging readings can be assigned to individual holes by appropriate markings. The contact between at least one centering hole and at least one centering bolt guides the exposing device to a horizontal alignment with respect to the frame, while the marked gaging rods simplify and accelerate a subsequent vertical alignment.

In subsequent adjustments of the entire system, for example in printing works, the gaging rods can then be inserted simply into the assigned holes and the distance between the centering hole and centering bolt or frame can be set according to the markings. In this way, it is possible to perform a vertical alignment simply. The gaging rods can then be removed again, with the result that there is no contact with the exposing device during operation.

In one inventive development of the apparatus, there is provision for the image-setting device to have a vertically adjustable auxiliary foot, preferably in the region of its main drive side.

A first "three-point alignment" of the exposing device can be performed by the auxiliary foot. The exposer can have, for example, four exposer feet. The first alignment of the exposing device is then performed by two exposer feet and the auxiliary foot, with the result that it is level. The remaining two exposer feet are then lowered, for example via screw threads, and initially brought into gentle contact with the floor. Then, for example, all four exposer feet can be adjusted by a defined amount, with the result that the auxiliary foot can be removed. In this simple way, the exposing device is made level, independently of the floor conditions. Subsequent height adjustments of the exposing device can then be performed by uniform adjustment of all four exposer feet.

If the exposing device is situated in a horizontal alignment with respect to the frame, for example, via the centering holes and centering bolts, it must still be possible to perform any fine adjustment of the transport system required relative to the exposing device. For this purpose, the transport system should be connected to an upper frame according to the invention.

For the purpose of this fine adjustment, there is provision according to the invention for the frame to contain an upper frame and a lower frame that can be separated from one another and can be pivoted at least temporarily about a common vertical axis by an angle $\phi$ and can be displaced at least temporarily laterally with respect to one another.

The transport system can then be aligned with the upper frame on the exposing device.

In order that the adjustment of the transport system and the exposing device is not lost during operation of the apparatus or when the contact between the lower frame and the exposing device is broken, there is provision according to the invention for the upper frame and the lower frame to be lockable with regard to the vertical axis and against lateral displacements.

The two frame parts can be connected to one another and then screwed together, for example, via screws and holes or slots.

In order that the contact between the lower frame and the exposing device can be broken in a simple manner, there is provision according to the invention for the lower frame to have height-adjustable housing feet for lowering and raising the lower frame.

The exposing device is initially still connected to the lower frame, for example via centering holes and centering bolts.

Here, struts of the lower frame that have the centering bolts are situated below the regions of the exposing device that have the centering holes. Here, for example, the exposing device can be lifted so far by the lower frame that the exposing device has no contact with the floor any more. The lower frame can then be lowered until the exposing device stands on the floor again and there is finally no more contact between the exposing device and the lower frame. It can then be lowered even further in such a way that the vertical distance between the exposing device and a transport system corresponds to the desired setting. The desired setting can be carried out either via gaging rods or other length gagers.

It is of course also possible that the lower frame can be raised for adjustment and that, for example, the exposing device can be raised with it as well. As a result, it is advantageously possible for the exposing device to be preadjusted by the contact and for a horizontal alignment of the frame or upper frame to be possible with respect to the exposing device without the exposing device being in contact with the floor.

Other features which are considered as characteristic for the invention are set forth in the appended claims.

Although the invention is illustrated and described herein as embodied in alignment elements for an apparatus for handling printing plates, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
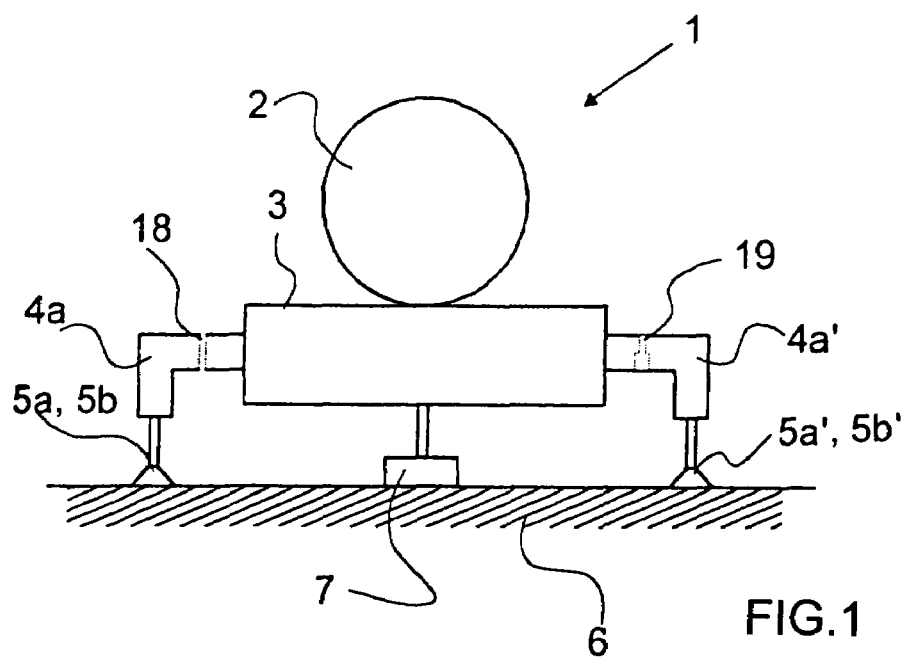
FIG. 1 is a diagrammatic, side-elevational view of a plate exposer with three-point contact according to the invention.

Referring now to the figures of the drawing in detail and first, particularly, to FIG. 1 thereof, there is shown a side view of a plate exposer 1. The plate exposer 1 is an exposing device that is to be aligned here relative to a transport system and a further device for handling printing plates. In particular, the time is to be reduced which is required to align an apparatus of this type at a client, for example a printer.

Figure 5:
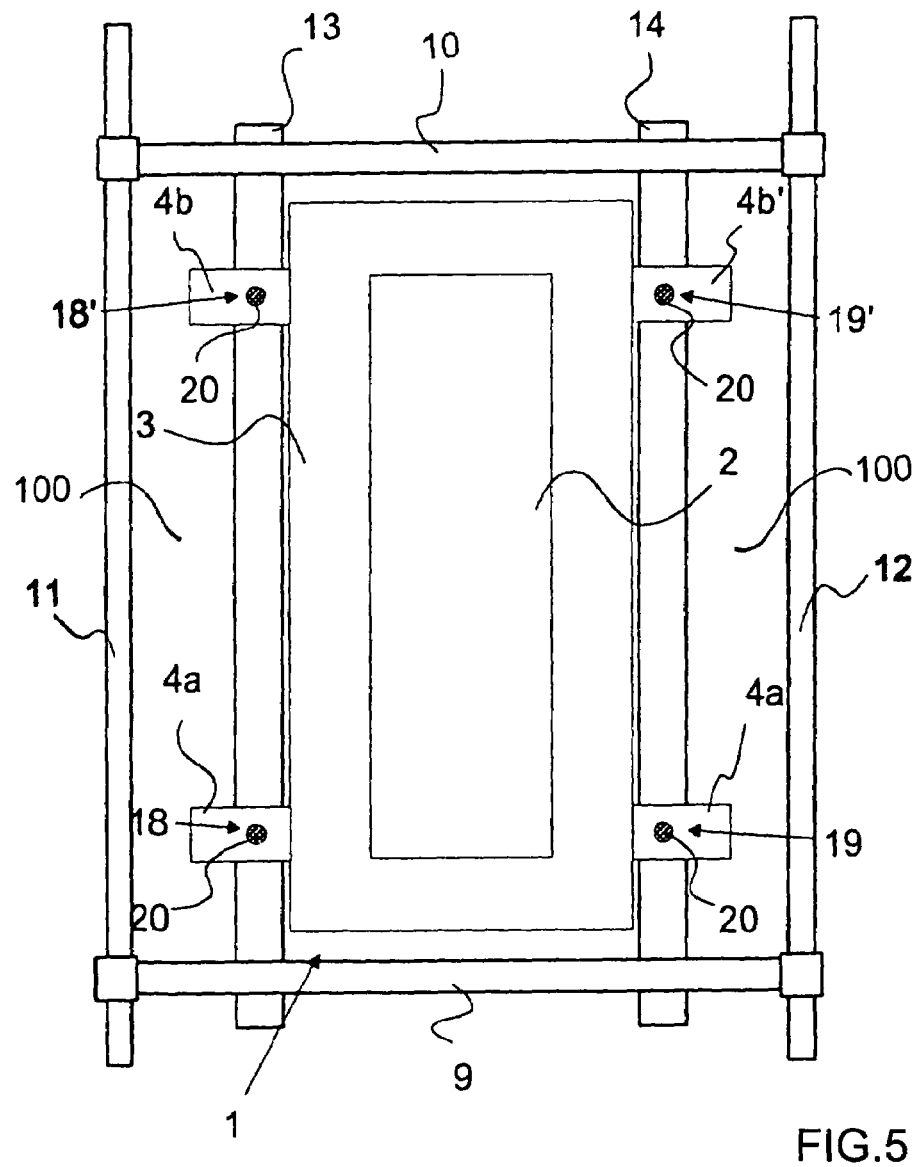
FIG. 5 is a diagrammatic, plan view of an aligned plate exposer having gaging rods.

The plate exposer 1 shown here is intended to be an external drum exposer. No exposing elements and drive elements are shown for reasons of better clarity. It is a diagrammatic representation. The plate exposer 1 contains a drum 2 and a base 3. Four spars 4a, 4a' and 4b, 4b' emerge from the base 3. Only the spars 4a and 4a' can be seen in the front view of the representation in FIG. 1. The remaining spars 4b, 4b' are shown in FIG. 5.

The spars 4a, 4a' end in height-adjustable exposer feet 5a, 5a'. Located at the rear part of the base 3 are the spars 4b, 4b' which in turn end at non-illustrated height-adjustable exposer feet 5b, 5b'.

The plate exposer 1 stands on a floor 6 using the exposer feet 5a, 5a' and 5b, 5b'. Here, the floor 6 can have unevennesses which can be compensated for by the exposer feet 5a, 5a' and 5b, 5b'. The exposer feet 5a, 5a' and 5b, 5b' are configured here as decoupling feet. Here, they have non-illustrated damping elements which at least reduce a transfer of vibrations from the floor 6 and/or from a frame 28 shown in FIG. 3 to the plate exposer 1.

In order to set up the plate exposer 1, there is another auxiliary foot 7 on the base 3. The auxiliary foot 7 can be screwed out of the base 3 or else tilted out at least partially. For setting-up purposes, the plate exposer 1 is initially placed onto the two exposer feet 5b and 5b' and the auxiliary foot 7 in the form of what is known as a three-point set-up. In particular in the case of an auxiliary foot 7 which has a fixed length and is tilted out of the base 3, the plate exposer 1 can then be made level by spirit levels or similar measuring units solely via adjustments of the exposer feet 5b and 5b'.

If the plate exposer 1 is made level in this three-point set-up, the remaining exposer feet 5a and 5a' are screwed down until they just touch the floor; this is also referred to often as "gentle contact".

If all the exposer feet 5a, 5a' and 5b, 5b' are then in contact with the floor, their height is adjusted further uniformly by a defined amount. In this way, the auxiliary foot 7 then has no contact any more with the floor and can be removed. This type of set-up makes it easily possible to ensure that the plate exposer 1 is level.

Figure 4:
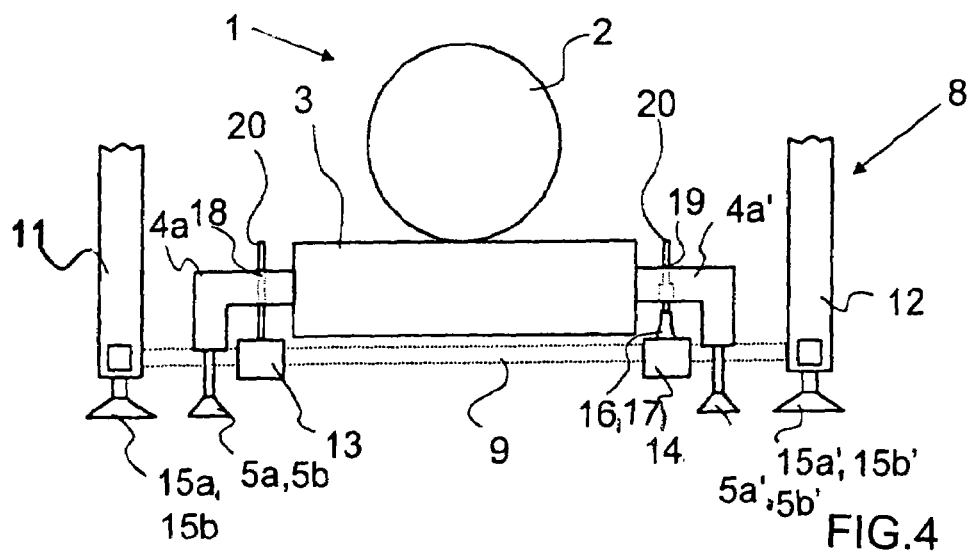
FIG. 4 is a diagrammatic, side-elevational view of an aligned plate exposer having gaging rods.

Furthermore, the plate exposer 1 has centering holes 18, 18' and 19, 19' in the spars 4a, 4b and 4a', 4b'. The centering holes 18, 18' have a uniform diameter that is sufficient to accommodate gaging or gauging rods 20. The gaging rods 20 are shown in FIG. 4. The centering holes 19, 19' are situated in the spars 4a' and 4b' and have a varying cross section. The cross section is sufficient at each point to accommodate the gaging rod 20; the cross sections are larger on the underside of the spars 4a' and 4b', with the result that centering bolts 16, 17 (not shown here) can be surrounded by the centering holes 19, 19'. The cross section of the centering holes 19, 19' changes in such a way that the centering bolts 16, 17 can be completely accomodated. The region of the centering holes 19, 19' which is not filled when the centering bolts 16, 17 are completely accomodated is constricted in such a way that they stand in a stable manner within the centering holes 19, 19' without tilting.

Figure 2:
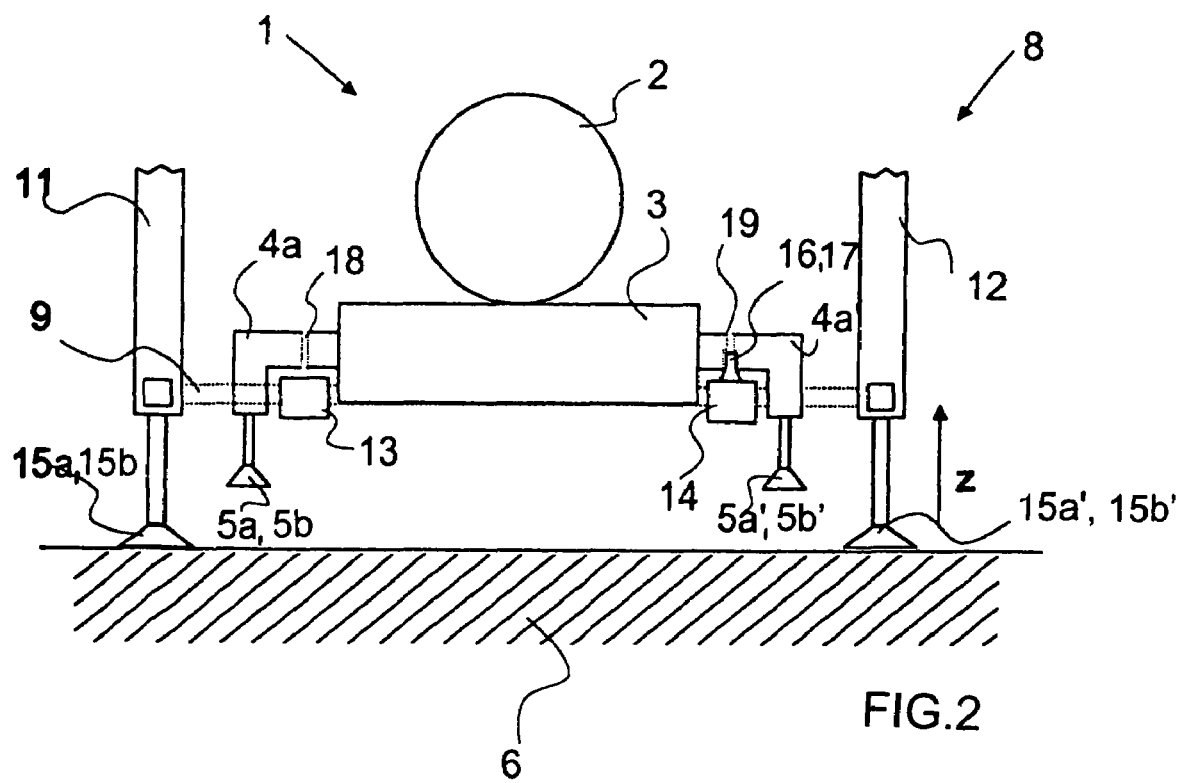
FIG. 2 is a diagrammatic, side-elevational view of the plate exposer which has been raised by a lower frame.

FIG. 2 shows a side view of the plate exposer 1 from FIG. 1, that plate exposer 1 is raised by a lower frame 8. This is the same side of the plate exposer that can also be seen in FIG. 1.

For a first relative alignment of the plate exposer 1, the latter is placed above the lower frame 8, initially without contact. The lower frame 8 has transverse struts 9 and 10 and cutouts 100. The transverse strut 10 can be seen in FIG. 5. The transverse struts 9 and 10 connect two side parts 11 and 12 of the lower frame 8. The vertical extent of the lower frame 8 is only implied here.

The transverse struts 9 and 10 are connected to one another via two parallel carrier struts 13 and 14. The carrier struts 13 and 14 extend under the spars 4a, 4a' and 4b, 4b'. On their underside, the side parts 11 and 12 each have frame feet 15a, 15a' and 15b, 15b'. The latter are height-adjustable. Only the frame feet 15a, 15a' on the displayed side of the plate exposer 1 are shown here.

The carrier strut 14 has two centering bolts 16 and 17. Only the centering bolt 16 is visible on that side of the plate exposer 1 shown in FIG. 2. It is attached to the carrier strut 14 in such a way that, in order to align the plate exposer 1, it lies below the latter's spar 4a'. The second centering bolt 17 correspondingly lies below the spar 4b'. The two centering bolts 16, 17 then lie directly below the centering holes 19, 19' of the spars 4a' and 4b' and can be accommodated by the latter.

The lower frame 8 can be raised via the frame feet 15a, 15a' and 15b, 15b' to such an extent that the centering bolts 16 and 17 are accommodated completely by the centering holes 19, 19'. The spars 4a, 4a' and 4b, 4b' of the plate exposer 1 then lie completely on the carrier struts 13 and 14 of the lower frame 8. Here, a certain alignment is realized by the centering bolts 16 and 17. The plate exposer 1 can be raised by the carrier struts 13, 14 themselves as a result of the lower frame 8 being raised further, so that the plate exposer 1 has no contact with the floor 6.

Figure 3:
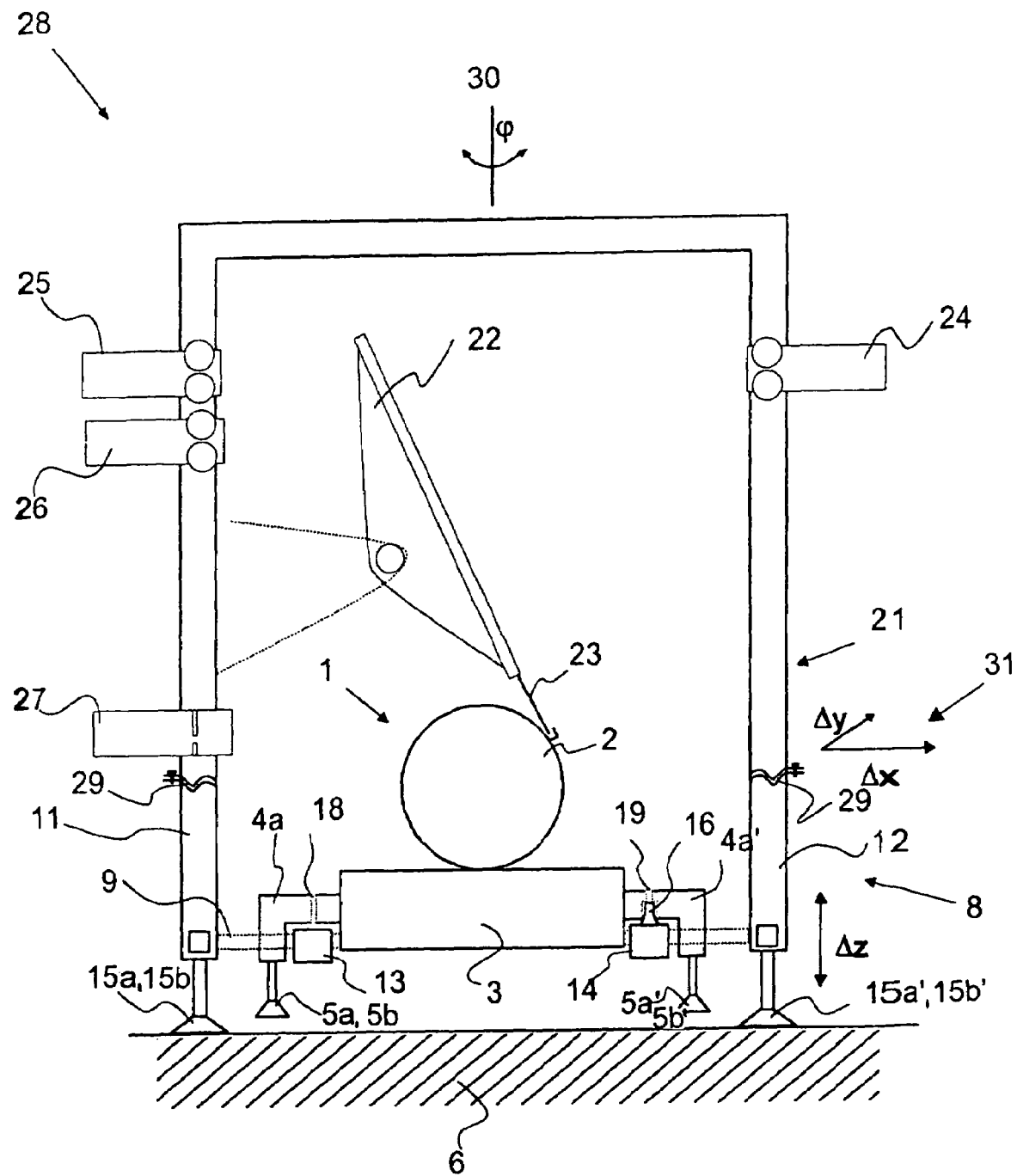
FIG. 3 is a diagrammatic, side-elevational view of an assembled apparatus having an upper frame and lower frame, plate exposer and transport system.

FIG. 3 shows a further side view of an assembled apparatus having an upper frame 21 and the lower frame 8, a plate exposer 1 and a transport system. The upper frame 21 and the lower frame 8 then jointly form the frame 28. The transport system shown is a pivotable double table 22. The double table 22 can transport two printing plates 23 simultaneously and deliver and receive them independently of one another. It is connected to the upper frame 21.

In the state of the apparatus shown here, the plate exposer 1 is raised by the lower frame 8 to the extent that the plate exposer 1 does not touch the floor 6. The upper frame 21 is situated on the lower frame 8.

Further processing stations are integrated in the upper frame 21. In the example shown here, these are a manual plate feed 24, a plate ejector 25, an automatic plate changer 26 and a punching device 27. Some of these processing stations, such as the punching device 27, can also be integrated in the lower frame 8. A common feature of all the processing stations is that they can be supplied with the printing plates 23 from the double table 22 or can transfer the printing plates 23 to the double table 22.

The double table 22 can be tilted in such a way that it can transfer a printing plate 23 to the drum 2. The printing plate 23 is clamped there in a non-illustrated fixing apparatuses. Conversely, the drum 2 can also transfer printing plates 23 to the double table 22. The double table 22 can then transport them on to the punching device 27 or else to the plate ejector 25.

The frame 28 is formed by the lower frame 8 and the upper frame 21. The latter are connected to one another via screw connections 29. The screw connections 29 have slots for connection purposes, with the result that the upper frame 21 can be rotated with respect to the lower frame 8 about a vertical axis 30 by an angle φ can be displaced in the horizontal plane by distances Δx and Δy (system of coordinates 31). In this way, the upper frame can thus be aligned on the plate exposer 1. After the horizontal alignment has been performed, the upper frame 21 and the lower frame 8 are screwed fixedly to one another. The horizontal alignment of the frame 28 with respect to the plate exposer 1 is maintained as a result, when the plate exposer has been aligned via the 20 centering holes 19, 19' and the centering bolts 16 and 17.

The frame 28 together with the processing stations can be aligned in the vertical plane on the apparatus (not shown here) via the frame feet 15a, 15a' and 15b, 15b', in that adjustments can be made by distances Δz.

When the frame 28 has been aligned in the horizontal plane with respect to the plate exposer 1, the frame 28 can be lowered via the frame feet 15a, 15a' and 15b, 15b', until the plate exposer 1 again stands on its exposer feet 5a, 5a' and 5b, 5b'. The frame 28 is then lowered until the centering bolts 16, 17 no longer touch the centering holes 19, 19'. The frame 28 and the plate exposer 1 can then be adjusted further relative to one another via the exposer feet 5a, 5a' and 5b, 5b' and/or the frame 28 can be adjusted further via the frame feet 15a, 15a' and 15b, 15b', in such a way that the distance between the drum 2 and the double table 22 coincides with a setpoint value such that it is possible to transfer printing plates. During the vertical alignment, a possible alignment of the frame with respect to external apparatuses, in particular, is also then taken into consideration.

FIG. 4 illustrates the case where the vertical alignment has been performed correctly. It shows a side view of an aligned plate exposer 1 having the gaging rods 20. The lower frame 8 is no longer in contact with the centering bolts 16, 17. In the drawing, the vertical extent of the lower frame 8 is only indicated for reasons of better clarity.

The gaging rods 20 are inserted into the centering holes 18, 18' and 19, 19'. The diameter of the gaging rods 20 is selected in such a way that they are disposed in a stable and perpendicular manner in all the centering holes 18, 18' and 19, 19'. The gaging rods 20 that are guided through the centering holes 18 and 18' stand on the carrier strut 13. The gaging rods 20 which are guided through the centering holes 19 and 19' stand on the centering bolts 16 and 17.

In this position, the gaging rods 20 are marked in such a way that they can each be assigned to a centering hole 18, 18' 19 or 19'. Height level markings are made on the gaging rods 20, which markings make it possible to discern the height level of a gaging rod 20 in the respective centering hole 18, 18', 19 or 19'. A height level marking of this type can be, for example, a line at that location on the gaging rod 20 which lies in one plane with the upper edge of a centering hole 18, 18', 19 or 19'.

If the apparatus that has been aligned in this way is transported, the upper frame 21 and the lower frame 8 remain connected to one another. During a new alignment of the apparatus in any desired environment, it is then sufficient to make the plate exposer 1 level above the carrier struts 13 and 14. This is usually achieved by the three-point set-up described with reference to FIG. 1. FIG. 5 shows a corresponding plan view of an aligned plate exposer 1 having the gaging rods 20.

For set-up purposes, the plate exposer 1 is initially set up within the frame 28 without contact. Here, the centering holes 19, 19' should already be situated above the centering bolts 16 and 17 but not enclose or touch the latter. If the plate exposer 1 is initially to be made level, there should not be any gaging rods 20 within the centering holes 18, 18' and 19, 19'.

Once the plate exposer 1 is level, the height of the frame 28 is adjusted via frame feet 15a, 15a' and 15b, 15b' in such a way that the plate exposer 1 is raised from the floor 6 completely and the centering bolts 16 and 17 are enclosed by the centering holes 19, 19'. In this way, a horizontal alignment of the plate exposer 1 with respect to the double table 22 and the remaining processing stations or with respect to the frame 28 is achieved reliably.

If it is not necessary for the plate exposer 1 to stand perpendicularly with respect to the floor 6, it is possible in each case to omit the leveling operation in the first step. It is then sufficient to position the plate exposer 1 in the frame 28 in such a way that the centering bolts 16 and 17 are about to be enclosed by the centering holes 19, 19' and the plate exposer 1 can be raised by the frame 28. A sufficient horizontal alignment is then also performed. A reliable footing on the floor 6 should preferably always be ensured initially when setting up the plate exposer 1. This can always be achieved in principle by a three-point set-up.

The still outstanding vertical alignment of the plate exposer 1 with respect to the frame 28 or vice versa can then be performed in two ways.

EXAMPLE 1

The frame 28 has to be aligned relative to further external apparatuses.

In this case, the frame 28 is initially aligned toward the external apparatuses while the plate exposer 1 is raised by the carrier supports 13 and 14. Then the marked gaging rods 20 are inserted into the associated centering holes 18, 18' and 19, 19'. The exposer feet 5a, 5a' and 5b, 5b' are then extended uniformly to the extent that the plate exposer 1 stands on the floor 6 and the height level markings of the gaging rods 20 display a correct vertical alignment of the plate exposer 1 relative to the frame 28. If it is not possible to align all the gaging rods 20 by the exposer feet 5a, 5a' and 5b, 5b' being extended or screwed out uniformly, the frame 28 can be adjusted via the frame feet 15a, 15a' and 15b, 15b' in such a way that a vertical alignment occurs. Alternatively, it is also possible to omit a horizontal alignment of the plate exposer 1 relative to the floor; the plate exposer 1 is then adapted to the frame 28 by deliberate adjustment of individual exposer feet 5a, 5a' and 5b, 5b' in such a way that a vertical alignment is performed. In this method, it is also possible to omit a previous horizontal alignment of the plate exposer 1 completely.

EXAMPLE 2

The frame 28 does not have to be aligned toward external apparatuses.

The frame feet 15a, 15a' and 15b, 15b' can then be lowered to such an extent that the exposer feet 5a, 5a' and 5b, 5b' touch the floor 6 reliably. If the plate exposer 1 should have been made level before this, adjustment of the exposer feet 5a, 5a' and 5b, 5b' is omitted completely and a vertical alignment is performed solely via deliberate adjustment of individual frame feet 15a, 15a' and 15b, 15b'. If the plate exposer 1 has not been made level before this, then it is possible to adjust both the frame feet 15a, 15a' and 15b, 15b' and the exposer feet 5a, 5a' and 5b, 5b' individually in such a way that the height level markings of the gaging rods 20 each assume the correct position and both the frame 28 and the exposer 1 have a solid footing on the floor 6. In this way, it is possible to achieve a vertical alignment.

The embodiments of the invention of the apparatus, having the auxiliary foot 7, the centering holes 19, 19', the centering bolts 16, 17, the gaging rods 20 and the upper frame 21 which can be displaced relative to the lower frame 8 laterally by distances Δx and Δy and by the angle φ, achieve the situation where an apparatus for handling printing plates which has been aligned correctly once can be dealt with advantageously in a simple and rapid manner in the event of new set-ups, for example at a customer.

I claim:

1. An apparatus for handling printing plates, comprising:
   at least one image-setting device functioning as an exposing device;
   a frame at least partially enclosing said image-setting device, said frame having cutouts formed therein;
   decoupling feet mounted to said image-setting device for standing on a floor and extending through said cutouts in said frame, said image-setting device being decoupled from said frame via said decoupling feet;
   at least one guiding alignment element assisting alignment of said image-setting device and said frame with respect to one another; and
   at least one gaging rod, said image-setting device having at least one centering hole formed therein for accommodating said gaging rod.

2. The apparatus according to claim 1, wherein said guiding alignment element is at least one centering bolt surrounded by said frame for making temporary contact between said image-setting device and said frame and for adjusting said image-setting device.

3. The apparatus according to claim 1, wherein said guiding element is a centering bolt, said at least one centering hole is one of a plurality of centering holes, at least one of said centering holes accommodating said centering bolt.

4. apparatus according to claim 1, wherein said gaging rod fits through said centering hole and can be marked, for adjusting a distance between said frame and said image-setting device.

5. The apparatus according to claim 1, wherein said image-setting device has a vertically adjustable auxiliary foot.

6. The apparatus according to claim 5, wherein said image-setting device has a main drive side, and said vertically adjustable auxiliary foot is disposed in a region of said main drive side of said image-setting device.

7. The apparatus according to claim 1, wherein said frame contains an upper frame and a lower frame which can be separated from one another and can be pivoted at least temporarily about a common vertical axis with respect to one another by an angle and can be displaced at least temporarily laterally with respect to one another.

8. The apparatus according to claim 7, wherein said upper frame and said lower frame can be locked with regard to pivoting movements about said common vertical axis and against lateral displacements.

9. The apparatus according to claim 7, wherein said lower frame has height-adjustable housing feet for lowering and raising said lower frame.

10. The apparatus according to claim 1, wherein said gaging rod is removable.

* * * * *